US006808395B2

(12) United States Patent
Lin et al.

(10) Patent No.: US 6,808,395 B2
(45) Date of Patent: Oct. 26, 2004

(54) COAXIAL CABLE TERMINATION CONNECTOR FOR CONNECTING TO A PRINTED CIRCUIT BOARD

(75) Inventors: Hsien-Chu Lin, Tu-Chen (TW); Chieh Chao Yu, Tu-chen (TW); Yung-Chien Chung, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/341,796

(22) Filed: Jan. 13, 2003

(65) Prior Publication Data

US 2004/0106304 A1 Jun. 3, 2004

(30) Foreign Application Priority Data

Nov. 29, 2002 (TW) .......................................... 91219294

(51) Int. Cl.[7] ................................................ H10R 12/00
(52) U.S. Cl. .......................................... 439/63; 439/578
(58) Field of Search ............................ 439/63–65, 582, 439/581, 578; 438/578–582

(56) References Cited

U.S. PATENT DOCUMENTS 3,715,708 A * 2/1973 Lloyd et al. ................ 439/675
3,879,103 A * 4/1975 Peltola et al. ............... 439/581
3,915,535 A * 10/1975 O'Keefe et al. .............. 439/63
4,645,288 A * 2/1987 Stursa ........................ 439/581
4,718,854 A * 1/1988 Capp et al. .................... 439/63
4,743,205 A * 5/1988 Mitani et al. ................. 439/78
4,795,352 A * 1/1989 Capp et al. .................... 439/63
4,881,912 A * 11/1989 Thommen et al. .......... 439/585
4,941,831 A * 7/1990 Tengler et al. ................ 439/63
5,011,415 A * 4/1991 Suzuki et al. ................. 439/63
5,120,258 A * 6/1992 Carlton ....................... 439/581
5,215,470 A * 6/1993 Henry et al. .................. 439/63
5,411,409 A * 5/1995 Gray et al. ................. 439/329
5,580,276 A * 12/1996 Mussen ...................... 439/581
5,595,499 A * 1/1997 Zander et al. ............. 439/352
5,611,707 A 3/1997 Meynier
5,752,839 A * 5/1998 Fiacco et al. ................. 439/63
5,807,117 A * 9/1998 Kempf et al. ................. 439/63
5,823,790 A * 10/1998 Magnuson ................... 439/63
5,879,190 A * 3/1999 Maruyama et al. ......... 439/582
5,904,578 A * 5/1999 Kubota et al. ................ 439/63
5,921,793 A 7/1999 Phillips
6,030,231 A 2/2000 Särkiniemi
6,036,540 A 3/2000 Beloritsky
6,164,977 A * 12/2000 Lester ......................... 439/63
6,287,144 B1 * 9/2001 Baffert ...................... 439/578

* cited by examiner

*Primary Examiner*—Tho D. Ta
*Assistant Examiner*—Larisa Tsukerman
(74) *Attorney, Agent, or Firm*—Wei Te Chung

(57) ABSTRACT

A coaxial cable termination connector (1) of a preferred embodiment of the present invention has a shell (10) defining a cavity (104), an insulative insert module (12) and a retainer (16) respectively received in the cavity of the shell, and a center pin (14) received in the insert module. The shell has a base portion (101) and a plurality of grounding pins (102) symmetrically extending downwardly from the base portion. The grounding pins and the center pin are respectively soldered on a printed circuit board. A coaxial cable is received in the shell, with an inner core conductor being electrically connected to the center pin, and a braided shielding layer being electrically connected to the retainer and the shell.

17 Claims, 4 Drawing Sheets

COAXIAL CABLE TERMINATION CONNECTOR FOR CONNECTING TO A PRINTED CIRCUIT BOARD

BACKGROUND OF THE INVENTION

1. Field of the Invention

The present invention generally relates to electrical connectors, and more particularly to a coaxial cable termination connector for mounting directly on a printed circuit board (PCB).

2. Description of the Prior Art

Coaxial connectors are often used to transmit signals in high-frequency applications. See U.S. Pat. Nos. 5,921,793 and 6,030,231, for example.

U.S. Pat. No. 5,921,793 discloses a coaxial connector which has a conductive housing, a dielectric sleeve, a center contact, and a central insulator. The dielectric sleeve is received in the conductive housing, the center contact is received in the central insulator and a pin contact section of the center contact is received in a cavity of the dielectric sleeve for electrically mating with a complementary plug connector.

U.S. Pat. No. 6,030,231 discloses another coaxial connector for mounting on a printed circuit board (PCB). The coaxial connector has a pipe like connector, a projection, and a center connector received in the pipe like connector. The projection forms a plurality of grounding pins for electrically connecting with grounding tabs on the PCB. The center connector forms an attachment pin on a free end thereof for electrically connecting with a conductor tab on the PCB. The pipe like connector and the center connector received therein are adapted to electrically mate with a complementary plug connector.

However, these conventional coaxial connectors need to cooperate with complementary plug connectors to achieve signal transmitting performance, and thus the quality of transmitted signals. Furthermore, the reliable engagement between the coaxial connectors and the complementary plug connectors is not ensured.

Hence, an improved connector is needed to eliminate the above mentioned defects of conventional connector assemblies.

BRIEF SUMMARY OF THE INVENTION

An object of the present invention is to provide a coaxial cable termination connector which directly connects a coaxial cable to a printed circuit board (PCB) while eliminating a mating connector thereby ensuring a more reliable electrical connection between the coaxial cable and the PCB on which the connector is mounted.

A coaxial cable termination connector of a preferred embodiment of the present invention has a metal shell, a metal retainer and an insulative insert module respectively received in the metal shell, and a center pin received in the insert module. The shell has a cylindrical portion defining a cavity, and the insert module and the retainer are received in the cavity. The shell further has a base portion and the base portion has a plurality of grounding pins symmetrically extending downwardly therefrom. The center pin has a connecting portion connecting with an inner core conductor of a coaxial cable. A metal braided shielding layer of the coaxial cable electrically connects to the retainer, and thus to the shell and the grounding pins.

Other objects, advantages and novel features of the invention will become more apparent from the following detailed description of a preferred embodiment when taken in conjunction with the accompanying drawings.

DETAILED DESCRIPTION OF THE INVENTION

Figure 1:
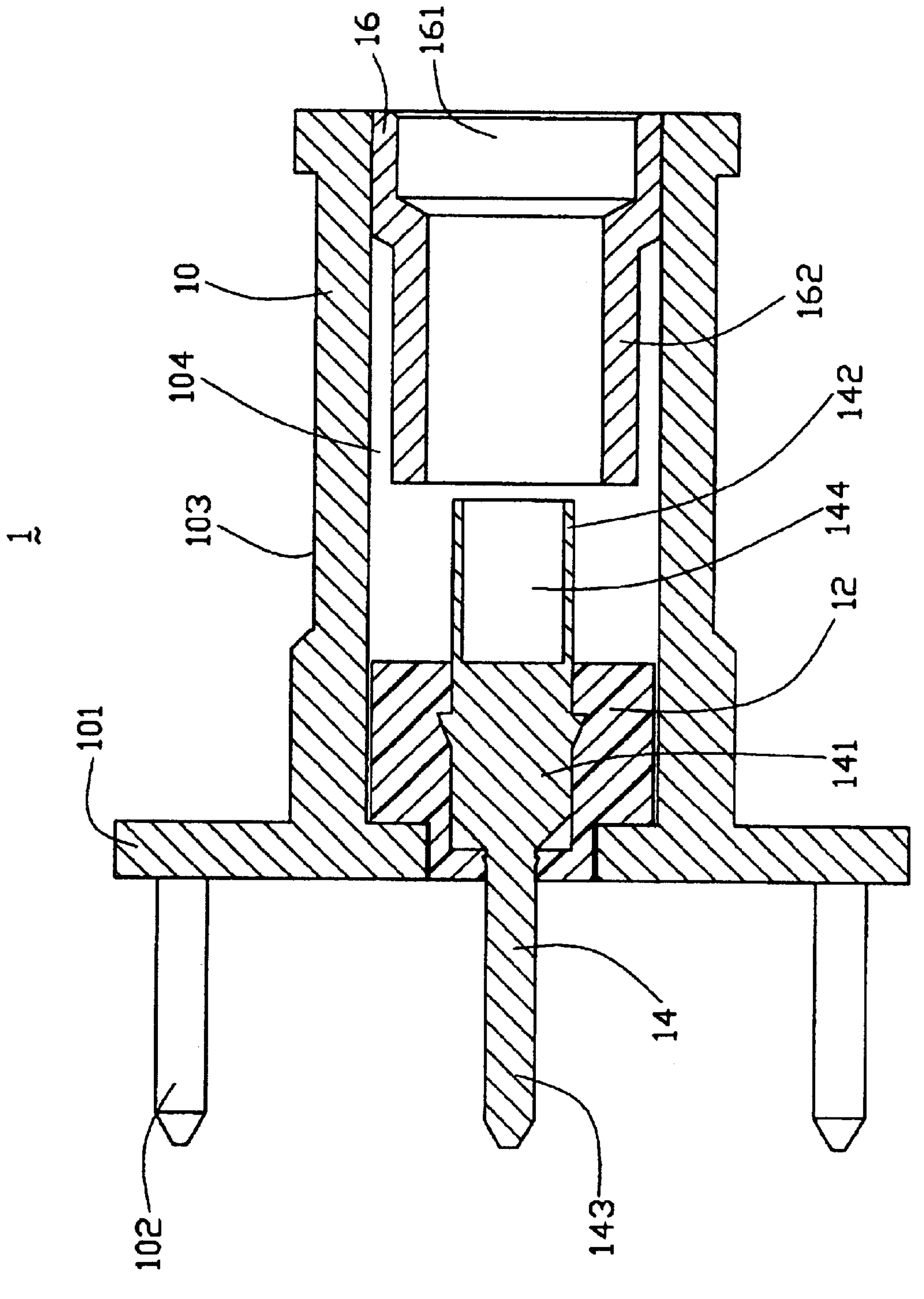
FIG. 1 is a cross-sectional view of a preferred embodiment of the present invention.

Referring to FIG. 1, a coaxial cable termination connector 1 of a preferred embodiment of the present invention has a metal shell 10, an insulative insert module 12, a center pin 14, and a retainer 16. A coaxial cable 18 having an inner core conductor 181 surrounded by an insulative layer 182, which is surrounded by a metal braided shielding layer 183, which in turn is surrounded by an outer jacket 184, is terminated by the coaxial cable termination connector 1.

The shell 10 has a base portion 101 and a cylindrical portion 103. The base portion 101 and the cylindrical portion 103 have a same axis. The base portion 101 has a plurality of grounding pins 102 extending symmetrically therefrom. The cylindrical portion 103 defines a cavity 104 therein for receiving the insert module 12.

The center pin 14 has a retaining portion 141, a connecting portion 142 extending from one end of the retaining portion 141, and a mating portion 143 extending from an opposite end of the retaining portion 141. The retaining portion 141 has a plurality of barbs (not labeled) formed thereon. The connecting portion 142 has a receiving slot 144 defined therein for receiving the inner core conductor of the coaxial cable.

The retainer 16 is a substantially cylindrical tubular structure and defines a receiving passage 161 extending therethrough. The retainer 16 forms a sustaining portion 162 at a free end thereof and an inner diameter of the sustaining portion 162 is identical to an outer diameter of the braided shielding layer of the coaxial cable. An outer diameter of an opposed end of the retainer 16 is a little larger than an inner diameter of the cylindrical portion 103 of the shell 10.

Figure 4:
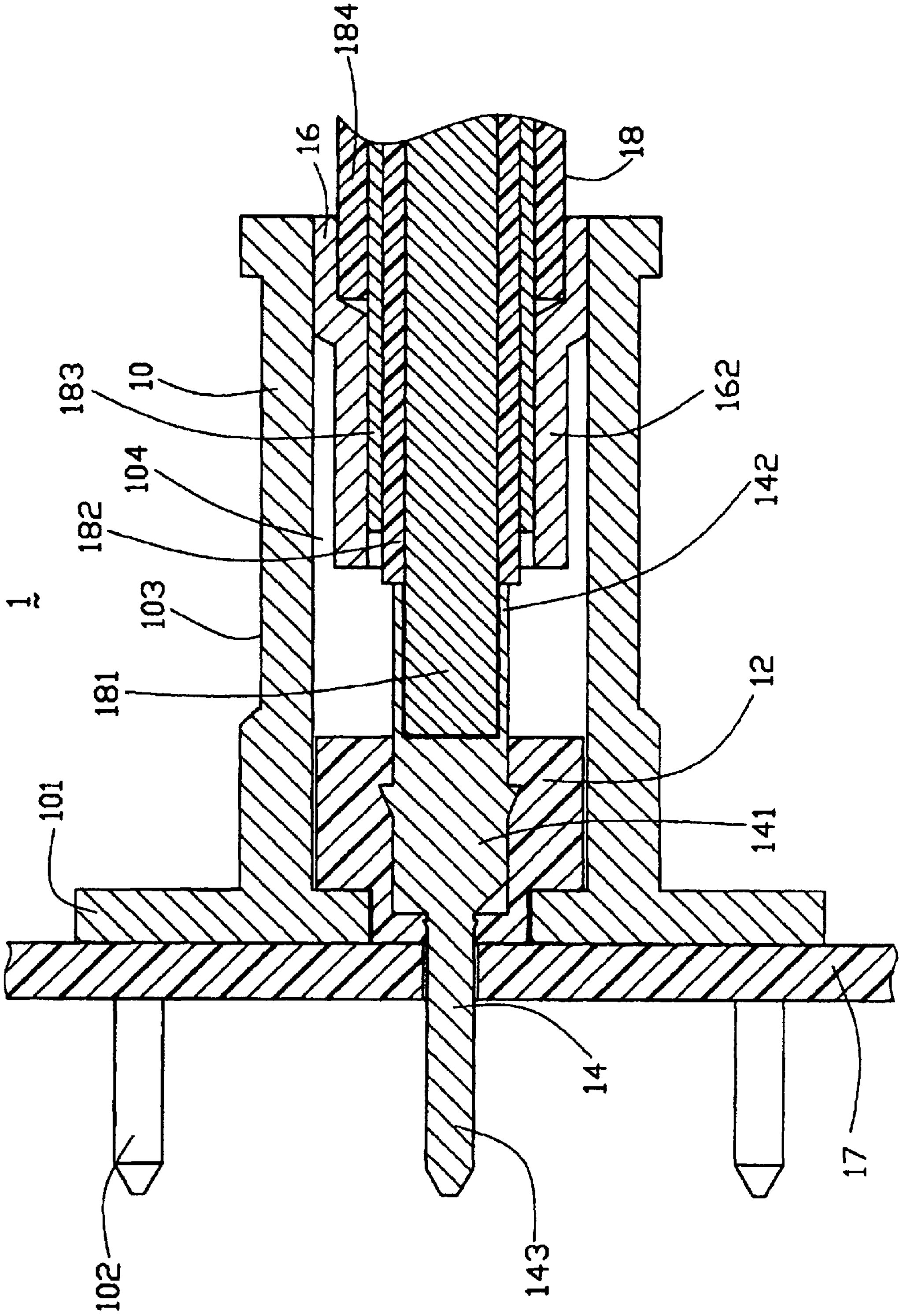
FIG. 4 is a cross-sectional view of present invention of FIG. 1, which is connecting to a cable and mounted on a printed circuit board.

Referring to FIG. 4, in assembly, the outer jacket 184, the braided shielding layer 183 and the insulative layer 182 of the cable 18 are stripped in order, and the inner core conductor 181 is received in the receiving slot 144 and is soldered to the center pin 14. The braided shielding layer 183 of the coaxial cable 18 is tightly received in the receiving passage 161 of the retainer 16. The retaining potion 141 of the center pin 14 is received in the insert module 12 with the barbs of the retaining portion 141 holding a firm engagement with the insert module 12. The insert module 12 is received in the cavity 104 of the shell 10 adjacent to the base portion 101 of the shell 10 with the mating portion 143 of the center pin 14 extending parallel to the grounding pins 102 of the shell 10. The retainer 16 is tightly received in the cavity 104 of the shell 10.

In use, the grounding pins 102 of the shell 10 and the mating portion 143 of the center pin 14 are respectively soldered to corresponding circuit traces on a printed circuit board (PCB) 17, thus an electrical connection is formed between the cable and the PCB 17 via the center pin 14 and the shell 10.

An advantage of the present invention over the prior art is that the coaxial termination connector 1 both directly terminates the coaxial cable and is mounted to the PCB 17. In particular, the grounding pins 102 are integrally formed on the metal shell 10, and the grounding pins 102 and the center pin 14 are directly soldered on the PCB 17. The inner core conductor 181 of the coaxial cable 18 is soldered to the center pin 14, the braided shielding layer 183 of the coaxial cable 18 is surrounded by the metal retainer 16. Thus, the coaxial cable 18 and the grounding pins 102 electrically connect with proper circuit traces on the PCB 17 via the center pin 14. As a result, signals are transmitted by the single coaxial cable termination connector 1 while eliminating a mating plug connector. Thus, a process of electrically connecting the cable 18 to the PCB 17 is remarkably simplified, and a reliable electrical connection between the cable 18 and the PCB 17 is ensured.

Figure 2:
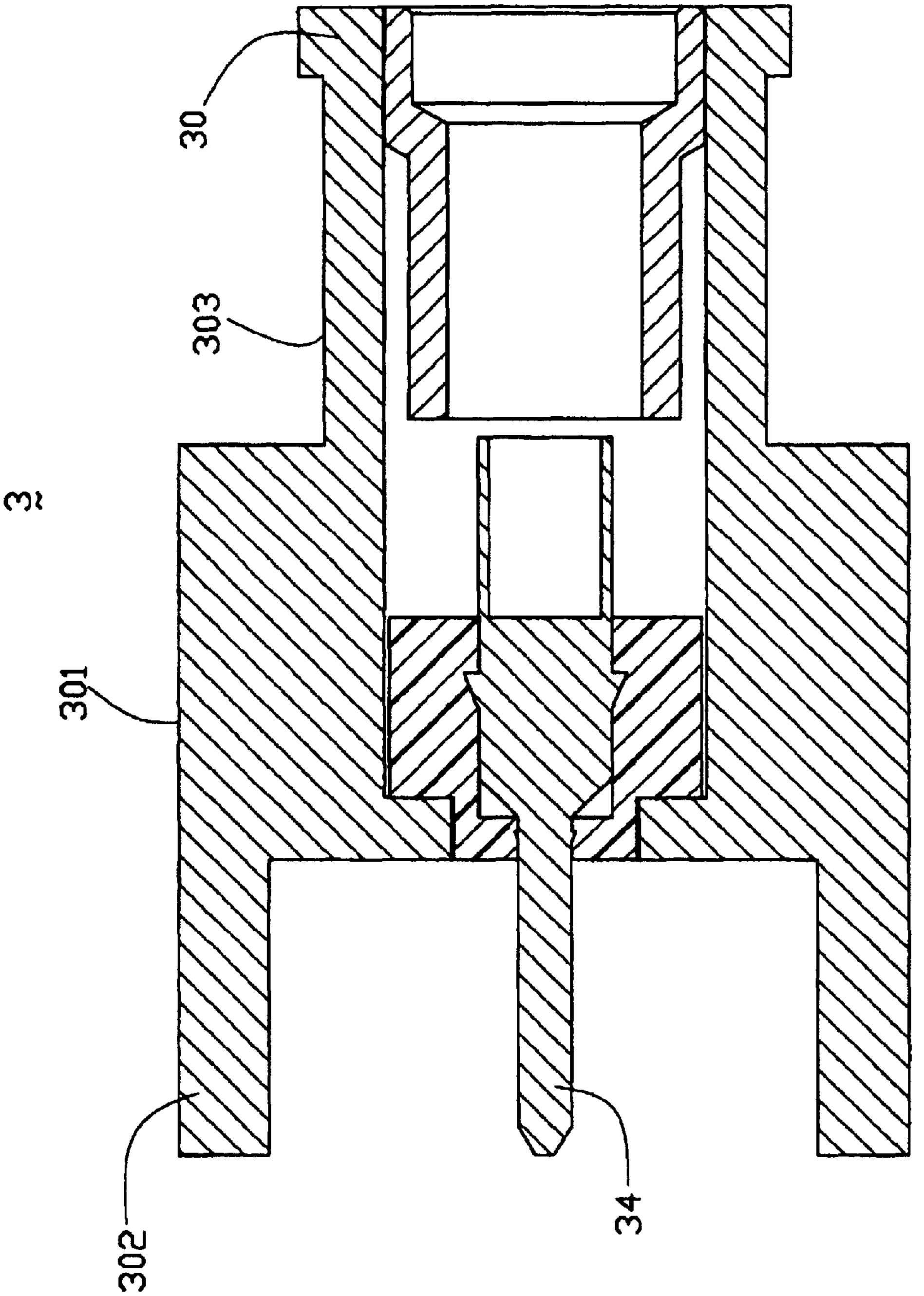
FIG. 2 is a cross-sectional view of a second embodiment of the present invention.

FIG. 2 shows a second embodiment of the present invention, in which a coaxial cable termination connector 3 has a structure and function similar to the coaxial cable termination connector 1 of the first embodiment. The coaxial cable termination connector 3 has a shell 30 including a base portion 301 and a cylindrical portion 303, an insert module (not labeled) received in the cylindrical portion 303 of the shell 30, and a center pin 34 received in the insert module. The base portion 301 has a plurality of grounding pins 302 symmetrically extending downwardly from side edges of the base portion 301.

Figure 3:
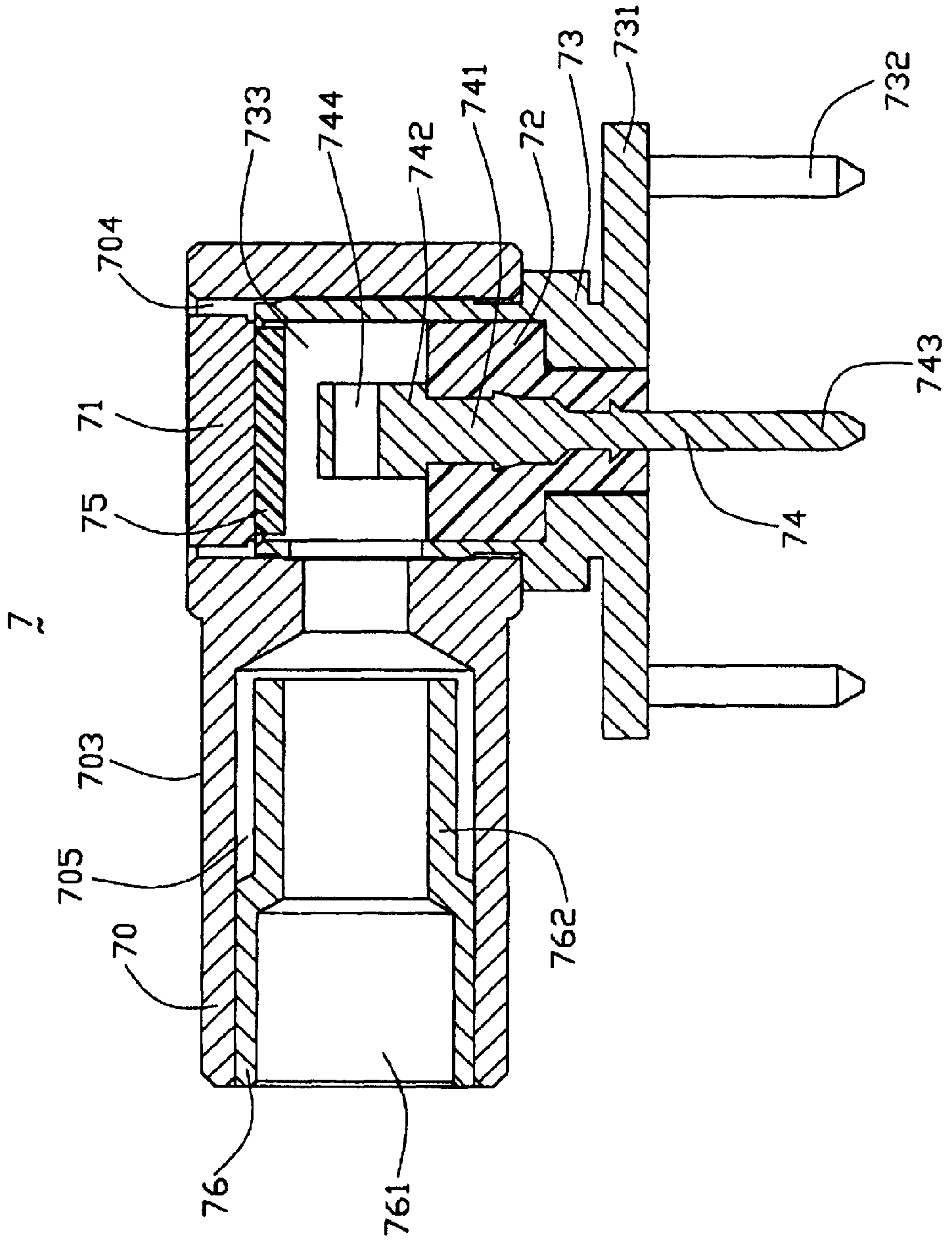
FIG. 3 is a cross-sectional view of a third embodiment of the present invention.

Referring to FIG. 3, a coaxial cable termination connector 7 of a third embodiment of the present invention has a metal shell 70, a shielding cover 71, an insulative insert module 72, a metal main body 73 received in the metal shell 70, a center pin 74 received in the insert module 72, an insulative rear cover 75, and a retainer 76. The coaxial cable termination connector 7 terminates a coaxial cable (not shown) like that terminated by the coaxial cable termination connector 1 and 3 of the prior described embodiments.

The shell 70 has a cylindrical portion 703 defining a first cavity 704 and a second cavity 705 therein. An axis of the cylindrical portion 703 and the second cavity 705 is perpendicular to an axis of the first cavity 704. The metal main body 73 is partially received in the first cavity 704 of the shell 70 and has a base portion 731 and a plurality of grounding pins 732 extending downwardly from the base portion 731. The metal main body 73 further defines a receiving hole 733 receiving the insert module 72 therein. The center pin 74 is received in the insert module 72 and has a retaining portion 741, a connecting portion 742 extending from an end of the retaining portion 741, and a mating portion 743 extending from an opposite end of the retaining portion. 741. The connecting portion 742 defines a receiving slot 744 extending therethrough, which electrically connects with a free end of an inner core conductor of the coaxial cable.

The retainer 76 is received in the second cavity 705 and defines a receiving passage 761 for receiving the coaxial cable and a sustaining portion 762. The structure and function of the retainer 76 of this embodiment is identical to that of the first embodiment. The coaxial cable termination connector 7 further has a shielding cover 71 and a rear cover 75. The shielding cover 71 is received in a top portion of the first cavity 704 of the shell 70 and connects with the shell 70. The rear cover 75 is received in a top portion of the receiving hole 733 of the metal main body 73 and is fixed under the shielding cover 71.

The coaxial cable termination connector 7 may also have another modification. The shell 70 and the main body 73 can be integrally made and in an L-shaped configuration.

It is to be understood, however, that even though numerous, characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A coaxial cable termination connector assembly adapted to be mounted on a printed circuit board (PCB), comprising:

a coaxial cable comprising an inner core conductor;

a metal shell, the metal shell having a plurality of grounding pins for electrically connecting with corresponding grounding circuit traces on the PCB;

an insulative insert module received in the shell; and a single center pin received in the insert module, the center pin having a connecting portion on an upper end thereof for directly connecting to the inner core conductor of the coaxial cable, and a contacting portion on a lower end thereof extending downwardly beyond a bottom face of the metal shell spatially away from the grounding pins for electrically connecting with a corresponding circuit trace on the PCB; wherein a metal shielding layer of the coaxial cable electrically connects with the PCB via the metal shell and the grounding pins, and the inner core conductor electrically connects the PCB via the single center pin.

2. The coaxial cable termination connector assembly of claim 1, wherein the metal shell has a base portion and the grounding pins integrally formed on the base portion.

3. The coaxial cable termination connector assembly of claim 1, wherein the metal shell has a cylindrical portion defining a cavity and the insert module is received in the cavity of the cylindrical portion.

4. The coaxial cable termination connector assembly of claim 1, wherein the connecting portion of center pin defines a receiving slot for receiving the inner core conductor of the coaxial cable therein.

5. The coaxial cable termination connector assembly of claim 1, wherein all part of the metal shell have a common axis and the metal shell is in a substantially straight sleeve.

6. The coaxial cable termination connector assembly of claim 1, wherein the metal shell is in a substantially L-shaped configuration.

7. The coaxial cable termination connector assembly of claim 1, further comprising a retainer defining a receiving passage for receiving the braided shielding layer of the coaxial cable therein.

8. A coaxial cable termination connector assembly adapted to be mounted on a PCB, comprising:

a coaxial cable comprising an inner core conductor;

a metal shell, the shell defining a cavity;

a metal main body, the main body being partially received in the cavity of the shell and having a plurality of grounding pins extending therefrom;

an insert module received in the main body; and a single center pin extending through the insert module, the center pin having a connecting portion on an upper end thereof for electrically connecting to the inner core conductor of the coaxial cable and a mating portion for connecting to the PCB; wherein the grounding pins and the mating portion of the center pin are respectively soldered to corresponding circuit traces on the PCB, and the inner core conductor of the coaxial cable electrically connect with the PCB via the single center pin, and a braided shielding layer of the coaxial cable connects with the PCB via the metal shell, the metal main body and the grounding pins.

9. The coaxial cable termination connector assembly of claim 8, further comprising a retainer received in the shell.

10. The coaxial cable termination connector assembly of claim 8, wherein the main body defines a receiving hole and the insert module is received in the receiving hole of the main body.

11. The coaxial cable termination connector assembly of claim 8, wherein an insulative rear cover is assembled into the receiving hole of the main body.

12. The coaxial cable termination connector assembly of claim 11, wherein a shielding cover is attached to the rear cover and is received in the cavity of the shell.

13. A coaxial cable termination connector assembly comprising:

a metal shell assembly mounted to a printed circuit board and defining a cavity;

an insulative insert located in a lower portion of the cavity;

a center pin extending through the insert upwardly into an upper portion of the cavity and also downwardly beyond a bottom face of the metal shell assembly;

at least one grounding pin extending downwardly from the shell assembly spatially away from the center pin;

a retainer retained to the upper portion of the cavity, said retainer defining an outermost large section and an innermost small section closer to said center pin than said larger section; and a coaxial cable extending out of the shell assembly and including an inner core conductor electrically connected to the center pin, an insulative layer enclosing said core conductor, a shielding layer enclosing the insulative layer and secured to an interior periphery of the small section, and an outer jacket enclosing said shielding layer and secured to an interior periphery of the large section.

14. The assembly of claim 13, wherein said shell assembly is seated upon printed circuit board through which said center pin and said grounding pin extend.

15. The assembly of claim 13, wherein said shell assembly is of a vertical type in which the retainer is located right above the insert.

16. The assembly of claim 13, wherein said shell assembly is of a right angle type in which the retainer is located in a horizontal section thereof laterally beside said insert.

17. The assembly of claim 13, wherein said shell assembly further includes a vertical section in which the insert is located, and said vertical section and said horizontal section are discrete from each other.

* * * * *